(12) United States Patent
Bi et al.

(10) Patent No.: US 11,561,634 B2
(45) Date of Patent: Jan. 24, 2023

(54) DISPLAY MODULE, FABRICATION METHOD THEREOF AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Xin Bi, Beijing (CN); Bin Zhang, Beijing (CN); Kun Zuo, Beijing (CN); Mingqiang Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/348,969

(22) Filed: Jun. 16, 2021

(65) Prior Publication Data
US 2022/0027005 A1    Jan. 27, 2022

(30) Foreign Application Priority Data
Jul. 22, 2020    (CN) .......................... 202010712407.2

(51) Int. Cl.
*G06F 3/041* (2006.01)
*H01L 27/32* (2006.01)
*G06F 3/044* (2006.01)
*H01L 51/56* (2006.01)

(52) U.S. Cl.
CPC .......... *G06F 3/0412* (2013.01); *G06F 3/0443* (2019.05); *G06F 3/0446* (2019.05); *H01L 27/323* (2013.01); *H01L 51/56* (2013.01); *G06F 2203/04103* (2013.01); *G06F 2203/04112* (2013.01); *H01L 27/3211* (2013.01)

(58) Field of Classification Search
None
See application file for complete search history.

(56) References Cited

U.S. PATENT DOCUMENTS 9,826,636 B2 * 11/2017 Park ................ H01L 51/444
10,292,234 B2 * 5/2019 Park ................ H05B 33/20

* cited by examiner

*Primary Examiner* — Duane N Taylor, Jr.
(74) *Attorney, Agent, or Firm* — Houtteman Law LLC

(57) ABSTRACT

The present disclosure provides a display module, a method for fabricating the display module and a display device. The display module includes a display substrate and a touch layer on a light emitting side of the display substrate, the display substrate includes a plurality of light emitting units, the touch layer includes a plurality of touch units in the touch area, and an orthographic projection of each of the plurality of touch units on the display substrate covers at least two light emitting units. Each touch unit includes: a mesh conductive structure including conductive wires arranged crosswise to define a plurality of grids, an orthographic projection of each conductive wire on the display substrate is in a space between adjacent light emitting units; and a plurality of first transparent electrodes, each of which is in the grid and electrically coupled to the conductive wire.

18 Claims, 7 Drawing Sheets

DISPLAY MODULE, FABRICATION METHOD THEREOF AND DISPLAY DEVICE

CROSS-REFERENCE TO RELATED APPLICATION

This application claims the benefit of priority to Chinese Patent Application No. 202010712407.2 filed on Jul. 22, 2020, the contents of which are incorporated herein in their entirety by reference.

TECHNICAL FIELD

The present disclosure relates to the field of display, and particularly relates to a display module, a fabrication method thereof and a display device.

BACKGROUND

An active-matrix organic light emitting diode (AMO-LED) panel originates from OLED display technology, and due to its self-luminous characteristic, the AMOLED panel has a high color gamut, a high contrast, and an ultra-light and thin structure, is accepted by more and more consumer markets, and is gradually applied to wearable devices.

The operation of the AMOLED panel having a touch function is more direct and more humanized, but the process for fabricating the touch layer on the AMOLED panel is more complex and the production cost is high.

SUMMARY

In one aspect, the present disclosure provides a display module including: a display substrate and a touch layer on a light emitting side of the display substrate. The display substrate includes a plurality of light emitting units, each of the plurality of light emitting units includes a first electrode, the first electrodes of the plurality of light emitting units are coupled to form a first electrode layer. The display module has a touch area and a driving area on a side of the touch area, the touch layer includes a plurality of touch units in the touch area, and an orthographic projection of each of the plurality of touch units on the display substrate covers at least two light emitting units of the plurality of light emitting units. Each of the plurality of touch units includes: a mesh conductive structure coupled to a touch signal terminal in the driving area and including a plurality of conductive wires arranged crosswise to define a plurality of grids, and an orthographic projection of each of the plurality of conductive wires on the display substrate is in an space between adjacent light emitting units; and a plurality of first transparent electrodes, each of which is in the grid and electrically coupled to the conductive wire.

In an embodiment, in each of the plurality of touch units, a sum of an area of orthographic projections of the plurality of conductive wires on the display substrate and an area of orthographic projections of the plurality of first transparent electrodes on the display substrate is greater than ½ of an area of the touch unit.

In an embodiment, areas of the plurality of touch units are the same, and in the plurality of touch units, areas of orthographic projections of the plurality of first transparent electrodes on the display substrate are the same.

In an embodiment, each of the plurality of touch units further includes a plurality of second transparent electrodes in a same layer as the plurality of first transparent electrodes. The plurality of first transparent electrodes are in some of the grids, the plurality of second transparent electrodes are in remaining grids, and the plurality of second transparent electrodes are insulated and spaced apart from the plurality of conductive wires.

In an embodiment, the plurality of first transparent electrode each include a body portion and a connection portion electrically coupled to the body portion, the connection portion is electrically coupled to the conductive wire, and the conductive wire is on a side of the connection portion away from the display substrate.

In an embodiment, a gap is provided on at least one of the plurality of conductive wires.

In an embodiment, a gap is provided on at least one of the plurality of conductive wires, and the gap and the connection portion are provided on opposite sides of the grid.

In an embodiment, in one touch unit, the gap includes a first gap, a second gap, and a third gap, the plurality of conductive wires of the mesh conductive structure include a plurality of horizontal wires extending along a row direction and a plurality of vertical wires extending along a column direction, the first gap is on a (2n)-th vertical wire, the second gap is on a (2n-1)-th vertical wire, and the third gap is on a horizontal wire between the (2n)-th vertical wire and the (2n-1)-th vertical wire, where n is a positive integer.

In an embodiment, the plurality of light emitting units include a plurality of light emitting groups arranged in an array, each of the light emitting groups includes a plurality of light emitting units of different colors, and each of the light emitting groups corresponds to at least one of the plurality of first transparent electrodes.

In an embodiment, each of the plurality of light emitting groups includes a red light emitting unit, a green light emitting unit, and a blue light emitting unit, a light emitting side of each of some of the plurality of light emitting groups is provided with one of the plurality of first transparent electrodes, and a light emitting side of each of remaining light emitting groups of the plurality of light emitting groups is provided with two of the plurality of first transparent electrodes.

In an embodiment, a width of the conductive wire is less than 3 μm.

In an embodiment, the touch layer further includes a plurality of transmission lines, in each of the plurality of touch units, the mesh conductive structure is coupled to the touch signal terminal through a corresponding one of the plurality of transmission lines, and the transmission line and the mesh conductive structure are in a same layer.

In an embodiment, the display module further includes: an encapsulation layer between the plurality of light emitting units and the touch layer; a polarizing layer on a side of the touch layer away from the display substrate; a protective layer between the touch layer and the polarizing layer; a cover plate on a side of the polarizing layer away from the touch layer; and an optical adhesive layer between the cover plate and the polarizing layer.

In another aspect, the present disclosure provides a method for fabricating a display module having a touch area and a driving area on a side of the touch area, and the method includes: providing a display substrate including a plurality of light emitting units, each of the plurality of light emitting units including a first electrode, and the first electrodes of the plurality of light emitting units being coupled to form a first electrode layer; and forming a touch layer on the display substrate, the touch layer including a plurality of touch units in the touch area, and an orthographic projection of each of the plurality of touch units on the display substrate covers at least two light emitting units of the plurality of light emitting units. Each of the plurality of touch units includes: a mesh conductive structure and a plurality of first transparent electrodes, the mesh conductive structure is coupled to a touch signal terminal in the driving area and includes a plurality of conductive wires arranged crosswise to define a plurality of grids, and an orthographic projection of each of the plurality of conductive wires on the display substrate is in a space between adjacent light emitting units, and each of the plurality of first transparent electrodes is located in the grid and electrically coupled to the conductive wire.

In an embodiment, in each of the plurality of touch units, a sum of an area of orthographic projections of the plurality of conductive wires on the display substrate and an area of orthographic projections of the plurality of first transparent electrodes on the display substrate is greater than ½ of an area of the touch unit.

In an embodiment, a step of forming the mesh conductive structure is performed after a step of forming the first transparent electrode.

In an embodiment, the method further includes: forming a transmission line. The mesh conductive structure is coupled to the touch signal terminal through the transmission line, and the transmission line is formed in synchronization with the mesh conductive structure.

In another aspect, the present disclosure provides a display device including a driving chip and the display module according to the present disclosure, the display device being configured to operate in a display stage and a touch detection stage; and the driving chip is configured to: provide a display driving signal to the light emitting unit to perform display in the display stage, and provide a touch signal to the touch unit to perform touch detection in the touch detection stage.

BRIEF DESCRIPTION OF THE DRAWINGS

The accompanying drawings, which are included to provide a further understanding of the disclosure and constitute a part of the specification, are used to explain the present disclosure together with the specific embodiments below, but do not constitute a limitation to the present disclosure. In the drawings:

FIG. 9b is a cross-sectional view taken along line B-B' of FIG. 9a;

DETAILED DESCRIPTION

The following detailed description of the embodiments of the disclosure is given by referring to the accompanying drawings. It should be understood that the specific embodiments described herein are only used to illustrate and explain the present disclosure, and are not used to limit the present disclosure.

Unless otherwise defined, technical or scientific terms used in the embodiments of the present disclosure should have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Similarly, the word "include", "comprise", or the like, means that the element or item preceding the word includes the element or item listed after the word and its equivalent, but does not exclude other elements or items. The terms "couple", "connect" and the like are not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

A conventional OLED touch display module usually adopts mutual capacitive touch detection, and has two main types of structure: one is an on-cell touch display module, and the other is an add-on display module. The on-cell touch display module is a display module having a touch function, in which a touch layer is directly formed on a surface of a display substrate; and the add-on display module is a display module having the touch function, which is formed by separately producing the touch layer and the display substrate and then attaching the touch layer and the display substrate together.

Figure 1:
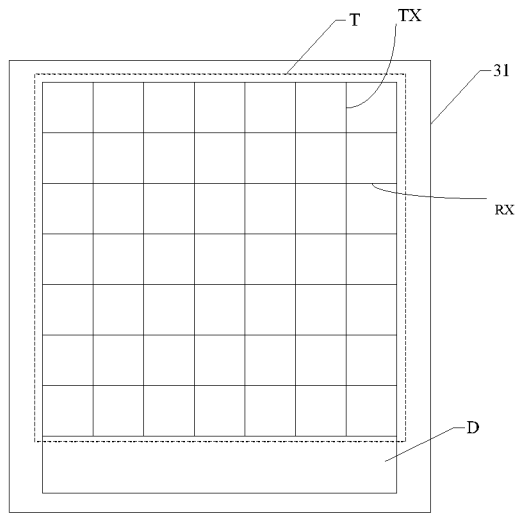
FIG. 1 is a plan view of a conventional display module.

In the touch layer of the conventional display module, referring to FIG. 1, when viewed in a plan view, the display module has a touch area T and a driving area D, and the touch area T includes touch electrodes TX and RX crossing each other.

Figure 2A:
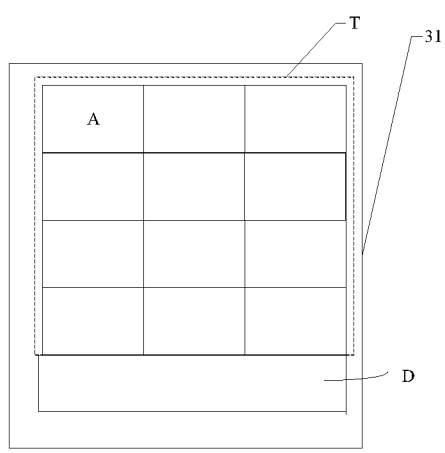
FIG. 2a is a plan view of a display module according to an embodiment of the present disclosure.
Figure 2B:
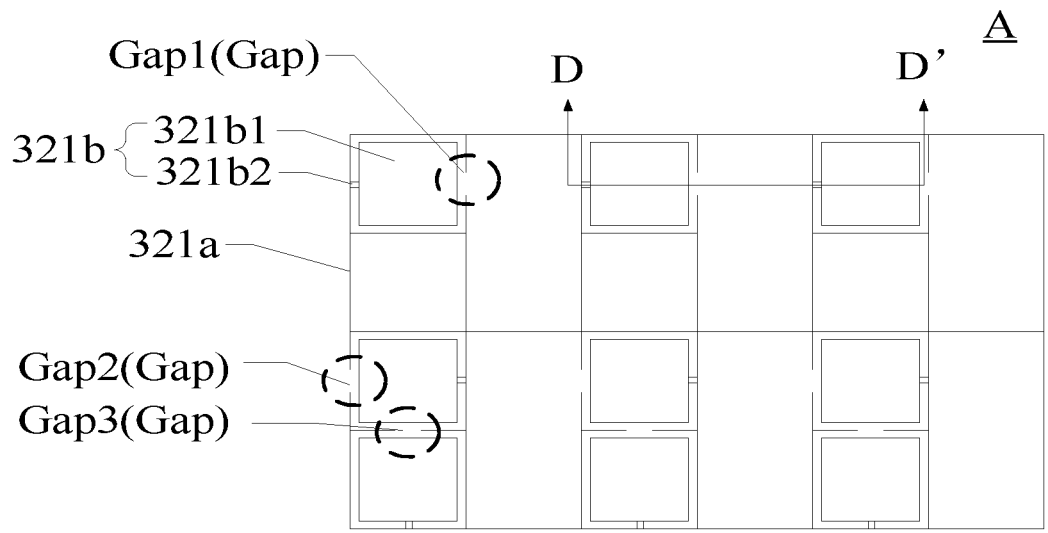
FIG. 2b is a plan view of one touch unit in the display module according to an embodiment of the present disclosure.

An embodiment of the present disclosure provides a display module, which may be a flexible display module and has the on-cell touch structure. FIG. 2a is a plan view of a display module according to an embodiment of the disclosure. FIG. 2b is a plan view of one touch unit in the display module according to the embodiment of the disclosure. In an embodiment, the touch area of the display module may include a plurality of touch units A arranged in an array. Each touch unit A may be coupled to the driving area through a transmission line.

Figure 3A:
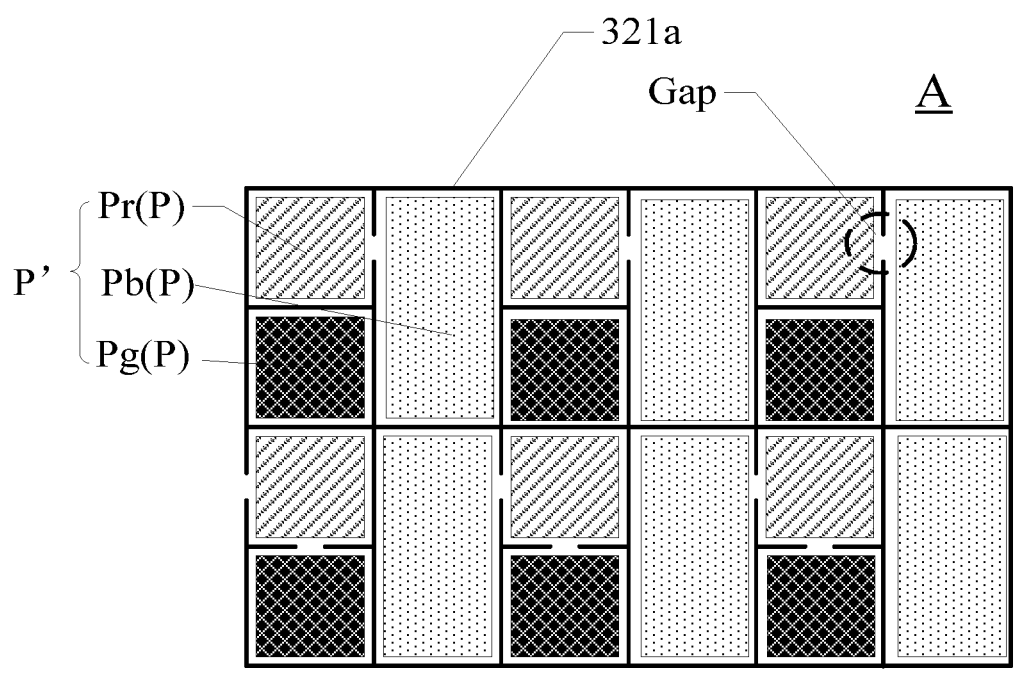
FIG. 3a is a schematic diagram of a mesh conductive structure of one touch unit and light emitting units.
Figure 3B:
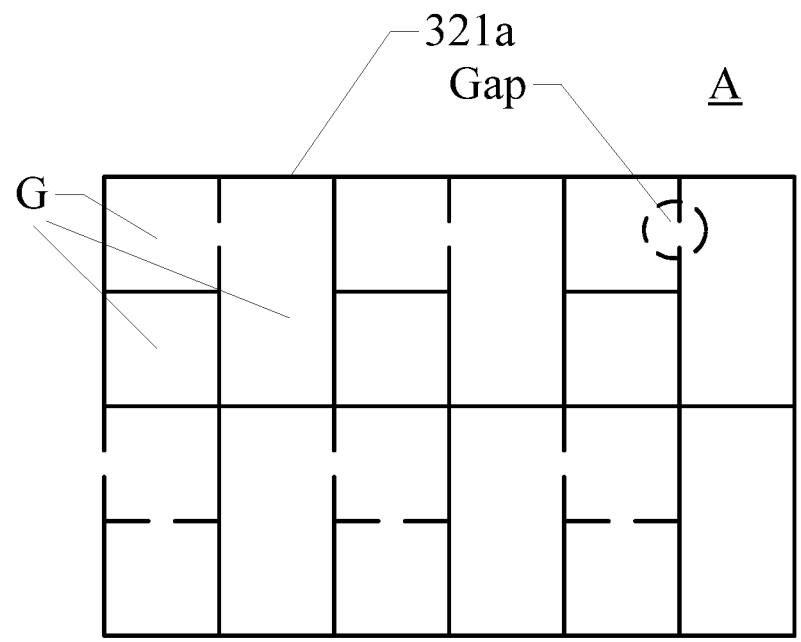
FIG. 3b is a schematic diagram of a mesh conductive structure of one touch unit.
Figure 3C:
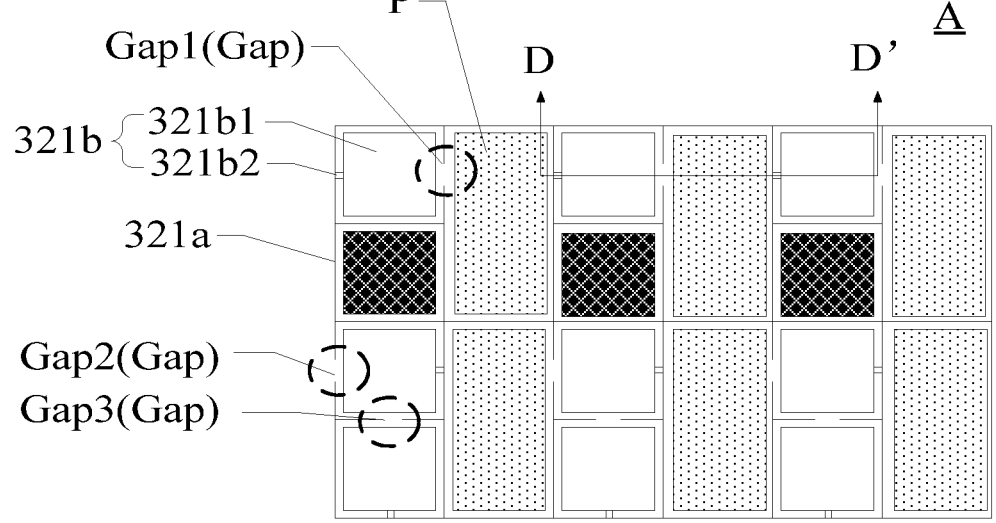
FIG. 3c is a schematic diagram of a mesh conductive structure and first transparent electrodes of one touch unit and light emitting units.
Figure 3D:
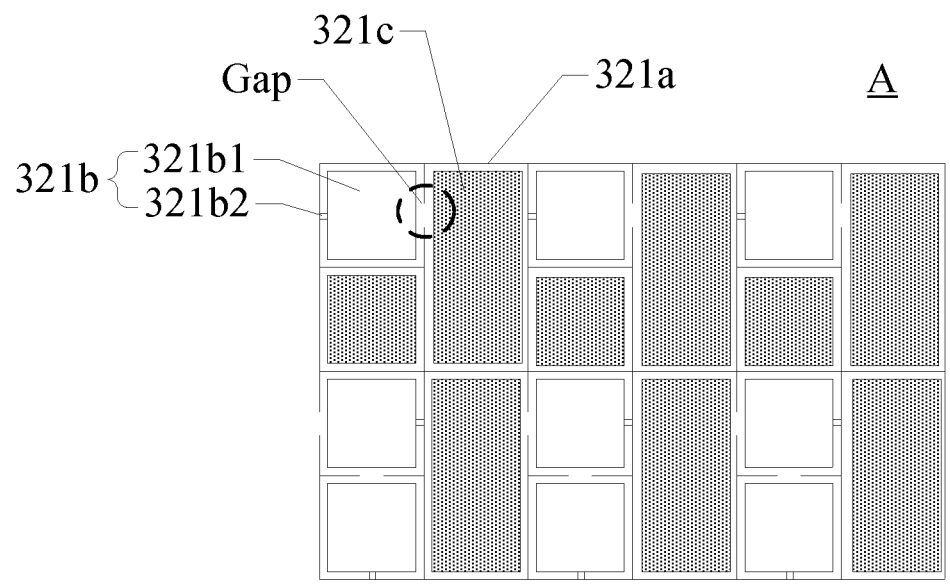
FIG. 3d is a schematic diagram of a mesh conductive structure, first transparent electrodes and second transparent electrodes of one touch unit.
Figure 4:
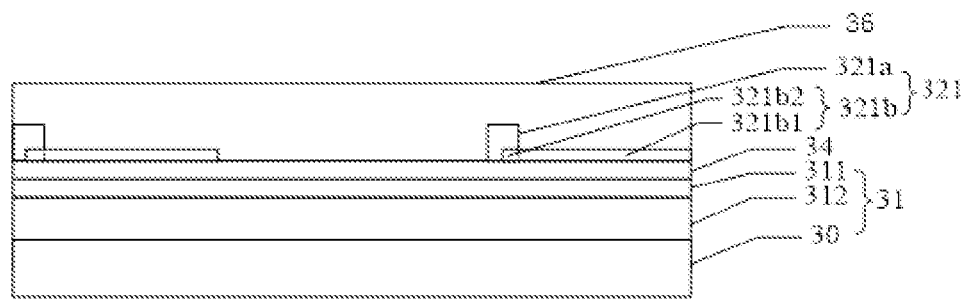
FIG. 4 is a cross-sectional view taken along line D-D' of FIG. 3c.
Figure 8:
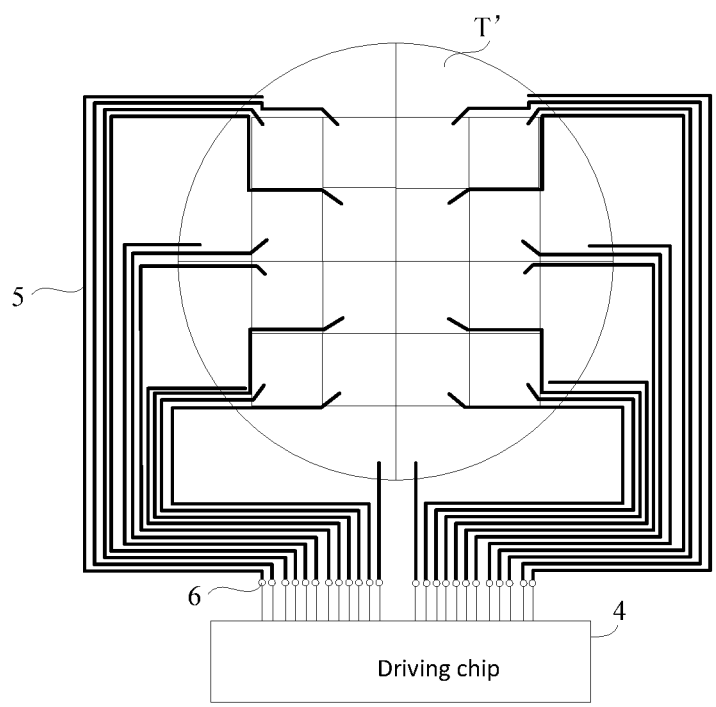
FIG. 8 is a schematic diagram of a display device according to an embodiment of the present disclosure.

In an embodiment of the present disclosure, the display module may be applied to a television, a mobile phone, or a portable wearable device. FIG. 2a only exemplarily shows that a light emitting surface of the display module may be rectangular (that is, the touch area is rectangular), but when the display module is applied to a portable wearable device (for example, a watch), the light emitting surface of the display module may also be circular (as shown in FIG. 8), which will be described in detail later and not repeated here. FIG. 3a is a schematic diagram of a positional relationship between a mesh conductive structure in a touch unit and light emitting units, FIG. 3b is a schematic diagram of a mesh conductive structure in a touch unit, FIG. 3c is a schematic diagram of a positional relationship between a mesh conductive structure and first transparent electrodes in a touch unit and light emitting units, and FIG. 3d is a schematic diagram of a mesh conductive structure, first transparent electrodes and second transparent electrodes in a touch unit. It should be noted that, in an actual product, the first transparent electrode is made of a light-transmissive material, which is substantially transparent, but for clarity of illustration, the light emitting unit is omitted at the position where the first transparent electrode is disposed in FIG. 3c. FIG. 4 is a cross-sectional view taken along line D-D' of FIG. 3c, and referring to FIGS. 2 to 4, the display module includes: a display substrate 31 and a touch layer disposed on a light emitting side of the display substrate 31. The display substrate 31 includes a plurality of light emitting units P, each of the light emitting units P includes a first electrode, and the first electrodes of the plurality of light emitting units P are coupled to form a first electrode layer 311. In an embodiment, the first electrode layer 311 may be a cathode layer formed as an entire layer.

The display module includes a touch area T and a driving area D located on a side of the touch area T, the touch layer includes a plurality of touch units A located in the touch area T, and an orthographic projection of each touch unit A on the display substrate 31 covers multiple light emitting units P. Each touch unit A includes: a mesh conductive structure 321a, and a plurality of first transparent electrodes 321b. The mesh conductive structure 321a is coupled to a touch signal terminal located in the driving area D through a transmission line. As shown in FIGS. 3a and 3b, the mesh conductive structure 321a includes a plurality of conductive wires, and the plurality of conductive wires are arranged crosswise to define a plurality of grids G. An orthogonal projection of each conductive wire on the display substrate 31 is located in a space between the adjacent light emitting units P. The first transparent electrode 321b is in the grid G, and each first transparent electrode 321b is coupled to the conductive wire, so as to be electrically coupled to the touch signal terminal through the mesh conductive structure 321a.

In an embodiment of the present disclosure, the light emitting unit P may be an organic light emitting diode (OLED), each of the light emitting units P further includes a light emitting functional layer 312 between the first electrode and a substrate 30, and the light emitting functional layer 312 may include a second electrode and a light emitting layer between the second electrode and the first electrode. The light emitting layer may emit, for example, red, green, blue or white light under the driving of a voltage between the first electrode and the second electrode. In an embodiment, the first electrode may be a cathode and the second electrode may be an anode. In an embodiment, one light emitting unit P may emit light having a specific color (e.g., red, green, or blue).

The mesh conductive structure 321a may be made of metal, metal alloy, or the like to reduce the resistance of the mesh conductive structure 321a. As shown in FIG. 2a, the touch units A may be distributed in an array. With reference to FIGS. 3a to 3c, each of the grids G of the mesh conductive structure 321a exposes one light emitting unit P, and the first transparent electrode 321b is disposed in the grid G, that is, the first transparent electrode 321b is located on the light emitting side of the light emitting unit P. The first transparent electrode 321b may be made of a conductive material having high light transmittance, such that the transmittance of the first transparent electrode 321b is greater than 96%, thereby preventing the first transparent electrode 321b disposed in the grid G from affecting the light emitting effect of the light emitting unit P. For example, the first transparent electrode 321b may be made of indium tin oxide (ITO) material. It should be noted that, in FIG. 3c, the shape (i.e., block shape) of the first transparent electrode 321b is only shown by way of example, and the specific shape thereof may be determined according to actual needs, and is not limited herein. For example, the shape of the first transparent electrode 321b may be a strip shape or a ring shape.

Compared with the conventional display module in which the mutual capacitance is adopted for touch detection, the display module according to the embodiment of the disclosure does not need to be provided with a driving electrode and a sensing electrode. For each touch unit A, self-capacitance can be generated between the first electrode layer 311 in the display substrate 31 and the mesh conductive structure 321a and the first transparent electrode 321b therein, so as to implement touch detection using a simple structure. During fabrication, it is only necessary to form a pattern including the first transparent electrode 321b and a pattern including the mesh conductive structure 321a respectively, which is beneficial to reduce the process steps.

The structure of the display module in the embodiment of the present disclosure will be described in detail below with reference to FIGS. 2a to 6. In some embodiments, for each touch unit A, a sum of an area of orthographic projections of the plurality of conductive wires on the display substrate 31 and an area of orthographic projections of the plurality of first transparent electrodes 321b on the display substrate 31 is greater than ½ of an area of the touch unit.

In an embodiment of the disclosure, in a case where the light emitting surface of the display module is circular, the touch units located at the edge of the display module may be fan-shaped, so that the touch area formed by the respective touch units A can cover the entire light emitting surface of the display module.

Figure 5:
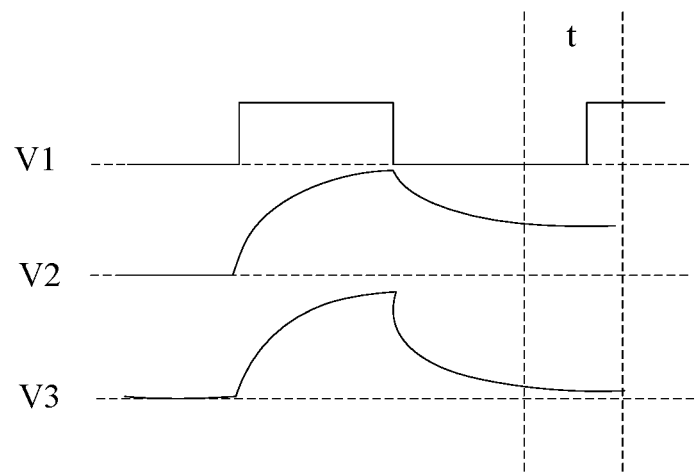
FIG. 5 is a schematic diagram illustrating a principle of touch detection according to an embodiment of the present disclosure.

For each touch unit A, the mesh conductive structure 321a and the first transparent electrodes 321b may generate a self-capacitance relative to the first electrode layer 311, and therefore, the sum of the area of the orthographic projection of the mesh conductive structure 321a on the display substrate 31 and the area of the orthographic projections of the first transparent electrodes 321b on the display substrate 31 is the effective touch area of the touch unit A. FIG. 5 is a schematic diagram illustrating a principle of touch detection according to an embodiment of the disclosure, and as shown in FIG. 5, during touch detection, a touch signal V1 whose potential changes periodically may be provided to the first transparent electrode 321b and the mesh conductive structure 321a of the touch unit A, and a reference signal whose potential is constant may be provided to the first electrode layer 311. When a touch occurs on the display module, the value of the self-capacitance between the touch unit A at the touch position and the first electrode layer 311 changes.

Accordingly, the voltage signal on the touch unit A collected by the driving chip also changes. For example, as shown in FIG. 5, V2 is the voltage signal on the touch unit A at the touch position, and V3 is the voltage signal on the touch unit A at a non-touch position. As is apparent from FIG. 5, at stage t when the touch occurs, the voltage signal V2 on the touch unit A at the touch position is higher than the voltage signal V3 on the touch unit A at the non-touch position. The touch position may be determined by analyzing the voltage signal of each touch unit A in the display module. In an embodiment, the variation of the value of the self-capacitance is dCs=Cs1−Cs2, where Cs1 is the value of the self-capacitance when the touch occurs, and Cs2 is the value of the self-capacitance before the touch occurs. The size of the effective touch area of the touch unit A is in direct proportion to the value of the self-capacitance between the touch unit A and the first electrode layer 311. When the value of the self-capacitance is too small, the difference between the capacitance when the touch occurs and the capacitance before the touch occurs is small, which is not favorable for touch detection (currently, the touch detection requirement is dCs>0.016 pF). When the display module is for example a circular structure, dCs at the edge position may be small, which may easily result in that the signal cannot be analyzed. However, in the display module according to the embodiment of the present disclosure, the sum of the area of the orthographic projection of the conductive wire on the display substrate 31 and the area of the orthographic projections of the first transparent electrodes 321b on the display substrate 31 is greater than ½ of the area of the touch unit, so that dCs at the edge position of the display module can reach more than 0.02 pF, thereby effectively solving the problem that the signal cannot be analyzed.

In some specific embodiments, the areas of the touch units A are the same, and the areas of the orthographic projections of the first transparent electrodes 321b on the display substrate 31 are the same in the respective touch units, so that the effective touch areas of the touch units A are consistent.

As shown in FIG. 3c and FIG. 4, in some specific embodiments, the first transparent electrode 321b includes a body portion 321b1 and a connection portion 321b2 coupled to the body portion 321b1, the connection portion 321b2 is coupled to the conductive wire, and the conductive wire is on a side of the connection portion 321b2 away from the display substrate 31.

In an embodiment of the present disclosure, the first transparent electrodes 321b may be first formed on the display substrate 31, and then the mesh conductive structure 321a is formed on the display substrate 31, and the conductive wire of the mesh conductive structure 321a is pressed on the connection portion of the first transparent electrode 321b, so as to ensure the stability of the connection between the first transparent electrode 321b and the conductive wire.

In an embodiment of the present disclosure, a thickness of the first transparent electrode 321b may be made much smaller than a thickness of the mesh conductive structure 321a. For example, the thickness of the first transparent electrode 321b is made smaller than 500 Å and the thickness of the mesh conductive structure 321a is made larger than 1000 Å, thereby improving the flatness of the mesh conductive structure 321a. The thickness of the mesh conductive structure 321a refers to the thickness of the conductive wire in the mesh conductive structure 321a.

In some specific embodiments, as shown in FIG. 3b, at least one of the conductive wires is provided with a gap GAP. In an embodiment of the present disclosure, the visibility of the mesh conductive structure 321a in the screen-off state can be effectively reduced by providing the gap GAP, and when the gaps GAP are irregularly distributed on the conductive wire, the visibility of the mesh conductive structure 321a in the screen-off state can be further reduced.

As shown in FIG. 3c, in some specific embodiments, the gap GAP may be located on the conductive wire adjacent to the first transparent electrode 321b, and the connection portion 321b2 of the first transparent electrode 321b and the gap GAP of the conductive wire are located on different sides of the body portion 321b1. That is, the gap GAP and the connection portion 321b2 are provided on opposite sides of the grid.

For example, as shown in FIG. 3c, the gap GAP in the mesh conductive structure 321a includes a first gap GAP1, a second gap GAP2, and a third gap GAP3, the conductive wires of the mesh conductive structure 321a include a plurality of horizontal wires extending along a row direction and a plurality of vertical wires extending along a column direction, the first gap GAP1 is on a (2n)-th vertical wire, the second gap GAP2 is on a (2n-1)-th vertical wire, and the third gap GAP3 is on a horizontal wire between the (2n)-th vertical wire and the (2n-1)-th vertical wire, where n is a positive integer.

In some specific embodiments, the width of the conductive wire is less than 3 μm, and the dielectric constant of the conductive wire is between 5 and 8 (e.g., 7), so as to further reduce the visibility of the mesh conductive structure 321a in the screen-off state.

In some specific embodiments, the plurality of light emitting units P are divided into a plurality of light emitting groups arranged in an array, each light emitting group includes a plurality of light emitting units P of different colors, and each light emitting group corresponds to at least one first transparent electrode 321b.

For example, as shown in FIG. 3a, each light emitting group P' includes three light emitting units, i.e., a red light emitting unit Pr, a green light emitting unit Pg, and a blue light emitting unit Pb. In an embodiment, each light emitting group P' corresponding to at least one first transparent electrode 321b means that at least one first transparent electrode 321b is disposed on the light emitting side of each light emitting group P'. For example, referring to FIGS. 3a and 3c, for the first row of light emitting groups P', the light emitting side of the red light emitting unit Pr is provided with the first transparent electrode 321b; for the second row of light emitting groups P', the light emitting sides of the red light emitting unit Pr and the green light emitting unit Pg are both provided with the first transparent electrodes 321b. Of course, the color of the light emitting unit, the light emitting side of which the first transparent electrode 321b is disposed on, may be determined according to actual needs, and the above embodiment is only an exemplary illustration. In practice, the first transparent electrode 321b may also be disposed on the light emitting side of the blue light emitting unit Pb in the first row of light emitting groups P' or the second row of light emitting groups P', which is not limited herein.

As described above, when the effective touch area of the touch unit A is too small, it is not beneficial to touch detection. In practical applications, when the effective touch area of the touch unit A is too large, noise is easily introduced during detection, which is not beneficial to touch detection either. To this end, in some embodiments of the present disclosure, the first transparent electrodes 321b are disposed in some of the grids G. Further, as shown in FIG. 3d, the touch unit A further includes a plurality of second transparent electrodes 321c, and the second transparent electrodes 321c are disposed in the same layer as the first transparent electrodes 321b. The first transparent electrodes 321b are disposed in some of the grids G, the second transparent electrodes 321c are disposed in the remaining grids G, and the second transparent electrode 321c is electrically isolated from the conductive wire. The transmittances of the first transparent electrode 321b and the second transparent electrode 321c may be the same or similar, so as to improve the display uniformity throughout the display module.

In an embodiment of the present disclosure, the first transparent electrodes 321b being disposed in some of the grids G and the second transparent electrodes 321c being disposed in the remaining grids G mean that, among the plurality of grids G of the mesh conductive structure 321a, some of the grids G are disposed with the first transparent electrodes 321b, and the remaining grids G are disposed with the second transparent electrodes 321c. That is, for any one of the grids G, only one of the first and second transparent electrodes 321b and 321c is provided therein.

For example, referring to FIGS. 3a and 3d, for the first row of light emitting groups P', the light emitting side of the red light emitting unit Pr is provided with the first transparent electrode 321b, and the light emitting sides of the green light emitting unit Pg and the blue light emitting unit Pb are both provided with the second transparent electrodes 321c; for the second row of light emitting groups P', the light emitting sides of the red light emitting units Pr and the green light emitting units Pg are both provided with the first transparent electrodes 321b, and the light emitting side of the blue light emitting unit Pr is provided with the second transparent electrode 321c. Of course, the colors of the light emitting sides, on the light emitting side of which the first transparent electrode 321b and the second transparent electrode 321c are disposed, may be determined according to actual needs, and the above embodiment is only an exemplary illustration. In practice, for the first row of light emitting groups P', the first transparent electrodes 321b may be disposed on the light emitting side of the blue light emitting unit Pb and the light emitting side of the green light emitting unit Pg, and the second transparent electrode 321c may be disposed on the light emitting side of the red light emitting unit Pr, which is not limited herein.

In an embodiment of the present disclosure, the first transparent electrode 321b and the second transparent electrode 321c are disposed in the same layer and have the same material, so that the first transparent electrode 321b and the second transparent electrode 321c can be formed simultaneously by the same patterning process, thereby simplifying the manufacturing process. For example, the first transparent electrode 321b and the second transparent electrode 321c may be made of indium tin oxide (ITO) material.

In some specific embodiments, the touch layer further includes a transmission line, the mesh conductive structure 321a is coupled to the touch signal terminal through the transmission line. The transmission line and the mesh conductive structure 321a are disposed in the same layer and made of the same material, so that the transmission line and the mesh conductive structure 321a can be formed simultaneously by the same patterning process, thereby simplifying the manufacturing process. When the touch layer in the embodiment of the present disclosure is fabricated, the first transparent electrode 321b and the second transparent electrode 321c may be formed through a single patterning process, and then the transmission line and the mesh conductive structure 321a are formed through a single patterning process, which can simplify the process steps compared with the structures in FIGS. 9b and 9d.

It should be noted that, in the embodiment of the present disclosure, a display signal terminal may be further disposed in the driving area D, and the first electrode and the second electrode of the light emitting unit P may be respectively coupled to the display signal terminal through respective transmission lines.

Figure 6:
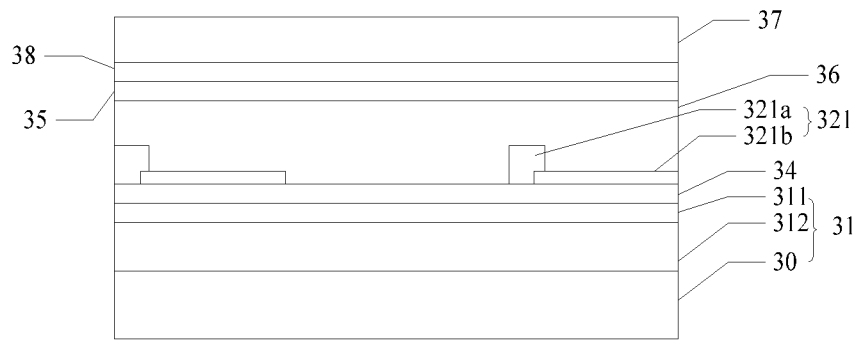
FIG. 6 is a schematic diagram of a specific structure of a display module according to an embodiment of the present disclosure.

FIG. 6 is a schematic diagram of a specific structure of a display module according to an embodiment of the disclosure. As shown in FIG. 6, in some specific embodiments, the display module further includes: an encapsulation layer 34, a polarizing layer 35, a protective layer 36, a cover plate 37 and an optical adhesive layer 38. The encapsulation layer 34 is disposed between the light emitting unit P and the touch layer. The polarizing layer 35 is disposed on a side of the touch layer away from the display substrate 31. The protective layer 36 is disposed between the touch layer and the polarizing layer 35. The cover plate 37 is disposed on a side of the polarizing layer 35 away from the touch layer. The optical adhesive layer 38 is disposed between the cover plate 37 and the polarizing layer 35.

Figure 7:
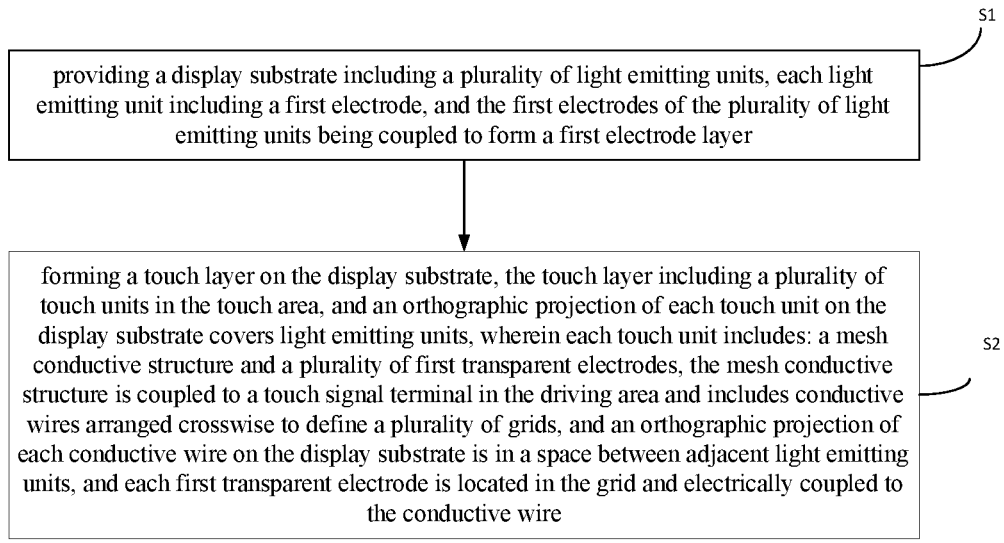
FIG. 7 is a flowchart of a method for fabricating a display module according to an embodiment of the present disclosure.

An embodiment of the present disclosure further provides a method for fabricating a display module, and the display module includes a touch area and a driving area located on one side of the touch area. FIG. 7 is a flowchart of the method for fabricating a display module according to an embodiment of the present disclosure, and as shown in FIG. 7, the method includes Steps S1 and S2.

Step S1 includes providing a display substrate. The display substrate includes a plurality of light emitting units, the light emitting unit includes a first electrode, and the first electrodes of the plurality of light emitting units are coupled to form a first electrode layer.

Step S2 includes forming a touch layer on a side of the display substrate.

The touch layer includes a plurality of touch units in the touch area, and the orthographic projection of each touch unit on the display substrate covers multiple light emitting units. Each touch unit includes a mesh conductive structure and a plurality of first transparent electrodes, and the mesh conductive structure is coupled to the touch signal terminal in the driving area. The mesh conductive structure includes a plurality of conductive wires arranged crosswise to define a plurality of grids, and an orthographic projection of each of the plurality of conductive wires on the display substrate is in a space between adjacent light emitting units, and each of the plurality of first transparent electrodes is located in the grid and electrically coupled to the conductive wire.

In an embodiment of the present disclosure, the mesh conductive structure and the first transparent electrode may be formed through two patterning processes, or may be formed through a single patterning process using a half tone mask (HTM Mask).

Compared with the conventional display module in which the mesh touch electrode is adopted for touch detection, the method of fabricating the display module according to the embodiment of the disclosure can generate a self-capacitance between the first electrode layer in the display substrate and the mesh conductive structure and the first transparent electrodes in each touch unit, so that touch detection is realized, the fabricating process is simple, and the cost is reduced.

It should be noted that, after the step of forming the mesh conductive structure and the first transparent electrodes, a protective layer may be further formed on the mesh conductive structure and the first transparent electrodes to protect the mesh conductive structure and the first transparent electrodes.

In some specific embodiments, for any one touch unit, the sum of the area of the orthographic projections of the conductive wires on the display substrate and the area of the orthographic projections of the first transparent electrodes on the display substrate is greater than ½ of the area of the touch unit.

In some embodiments, the first transparent electrode includes a body portion and a connection portion. When the mesh conductive structure and the first transparent electrode are formed through two patterning processes, the step of forming the mesh conductive structure is performed after the step of forming the first transparent electrode, so that the conductive wires of the mesh conductive structure are pressed on the connection portion of the first transparent electrode, thereby achieving connection between the first transparent electrode and the mesh conductive structure.

In some specific embodiments, the method further includes forming a transmission line, and the mesh conductive structure is coupled to the touch signal terminal through the transmission line. In an embodiment, the transmission line is formed in synchronization with the mesh conductive structure.

At present, in a conventional display module, a display driving chip (DIC) for providing a display signal and a touch driving chip (TIC) for providing a touch signal need to be bound separately, the display driving chip (DIC) may be coupled to a main flexible circuit board (MFPC), and the touch driving chip needs to be coupled to the main flexible circuit board (MFPC) through a touch flexible circuit board (TFPC). In order to prevent the display signal and the touch signal from interfering with each other, the main flexible circuit board (MFPC) needs to be provided with a connector for communicating with the touch flexible circuit board (TFPC), and therefore, the main flexible circuit board (MFPC) needs to be designed as a 4 to 6-layer structures, and the process is complex.

In view of this, the present disclosure further provides a display device. FIG. 8 is a schematic diagram of the display device according to an embodiment of the present disclosure. As shown in FIG. 8, the display device includes a driving chip 4 and the display module described above, and the display device may operate in a display stage and a touch detection stage.

The driving chip 4 is configured to provide a display driving signal to the light emitting unit to perform display in the display stage, and provide a touch signal to the touch unit to perform touch detection in the touch detection stage.

The display device may be any product or component with a display function, such as a portable wearable device (e.g., a watch), an electronic paper, an OLED panel, a mobile phone, a tablet computer, a television, a display, a notebook computer, a digital photo frame, a navigator, etc.

In an embodiment of the present disclosure, referring to FIG. 8, the touch area includes a plurality of touch units T'. The touch unit T' may be a regular pattern such as a rectangular pattern, or may be an irregular pattern, which is not limited herein. For example, when the light emitting surface of the display module is circular, the touch units T' located at the edge of the display module may be fan-shaped, so that the touch area including the touch units T' can cover the entire light emitting surface of the display module. Each touch unit T' is coupled to a touch signal terminal 6 in the driving area through a transmission line 5. It is understood that a display signal terminal (not shown) is further disposed in the driving area for connecting to the light emitting unit. The driving chip can be a TDDI (touch and display driver integration) chip. In this case, the display signal terminal and the touch signal terminal 6 in the driving area are both coupled to the TDDI chip, so that a touch flexible circuit board (TFPC) can be omitted, the fabrication process is simplified, and the cost is reduced. At the same time, due to the use of TDDI chip, the main flexible circuit board (MFPC) does not need to be connected to the TDDI chip through a connector. Therefore, the main flexible circuit board (MFPC) can be designed as a simple two-layer structure to further reduce costs.

Figure 9A:
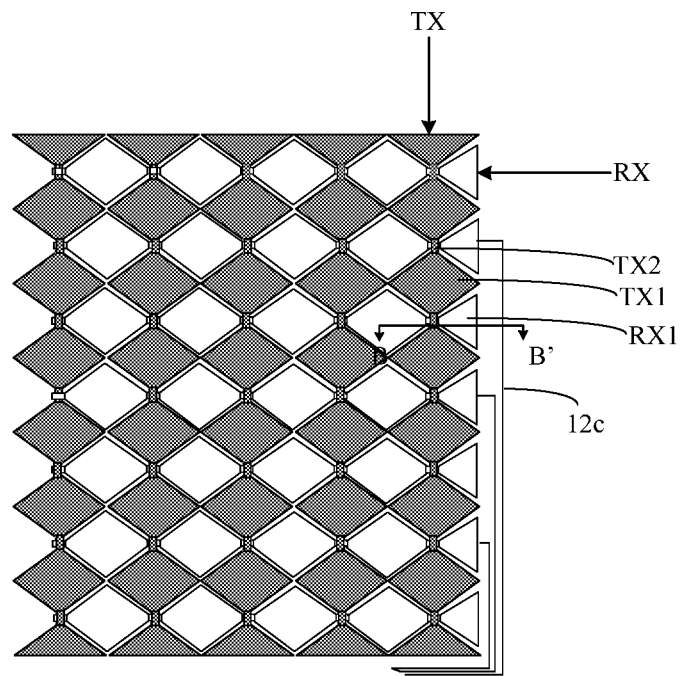
FIG. 9a is a plan view of a conventional display module having an on-cell touch structure.
Figure 9B:
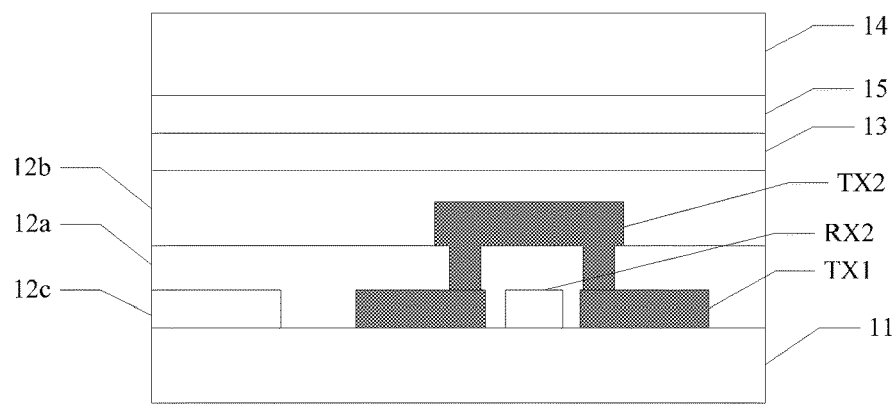

FIG. 9a is a plan view of a display module having an on-cell touch structure according to an embodiment, and FIG. 9b is a cross-sectional view taken along line B-B' of FIG. 9a. As shown in FIGS. 9a and 9b, the display module includes a display substrate 11 and a touch layer on a side of the display substrate 11. The touch layer includes: a driving electrode TX, a sensing electrode RX, a first insulating layer 12a, a second insulating layer 12b, and a signal transmission line 12c. The driving electrode TX includes a plurality of driving electrode blocks TX1 arranged in a first direction and bridge portions TX2 each coupled between adjacent driving electrode blocks TX1, the sensing electrode RX includes sensing electrode blocks RX1 and connection portions RX2 each coupled between adjacent sensing electrode blocks RX1, and the driving electrode TX and the sensing electrode RX are coupled to a touch terminal through a signal transmission line 12c. The sensing electrode RX and the driving electrode block TX1 are disposed in the same layer, the bridge portion TX2 is located on a side of the first insulating layer 12a away from the sensing electrode RX, and the driving electrode block TX1 is disposed on a side of the display substrate 11 close to the first insulating layer 12a. The bridge portion TX2 connects adjacent driving electrode blocks TX1 through a via in the first insulating layer 12a. The display module further includes a polarizing layer 13 and a cover plate 14 which are sequentially arranged on a side of the touch layer away from the display substrate 11, and the polarizing layer 13 is bonded to the cover plate 14 through an optical adhesive layer 15.

In some embodiments, the touch layer includes: a driving electrode TX, a sensing electrode RX, a first insulating layer 12a, a second insulating layer 12b, and a signal transmission line 12c. The driving electrode TX includes a plurality of driving electrode blocks TX1 arranged in a first direction and bridge portions TX2 each coupled between adjacent driving electrode blocks TX1, the sensing electrode RX includes sensing electrode blocks RX1 and connection portions RX2 coupled between adjacent sensing electrode blocks RX1, and the driving electrode TX and the sensing electrode RX are coupled to a touch signal terminal through a signal transmission line. The sensing electrode RX and the driving electrode block TX1 are disposed in the same layer, and the bridge portion TX2 is farther from the display substrate 11 than the sensing electrode RX and is disposed in the second insulating layer 12b. The bridge portion TX2 connects adjacent driving electrode blocks TX1 through a via in the first insulating layer 12a.

In an embodiment, the driving electrode TX and the sensing electrode RX are both transparent electrodes.

Figure 9C:
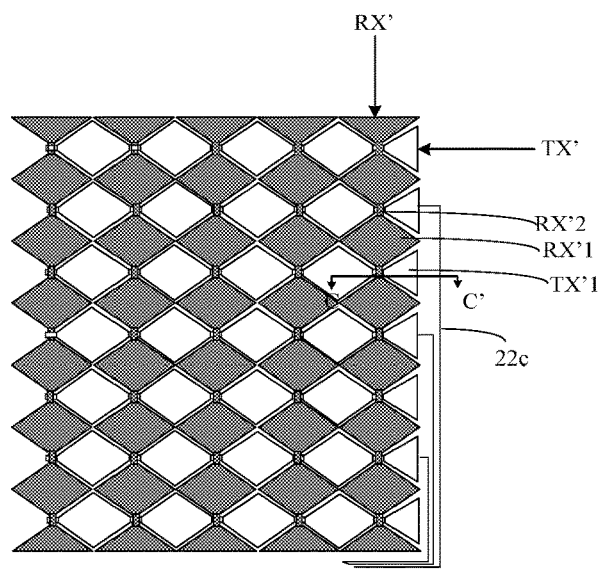
FIG. 9c is a plan view of a conventional display module having an add-on touch structure.
Figure 9D:
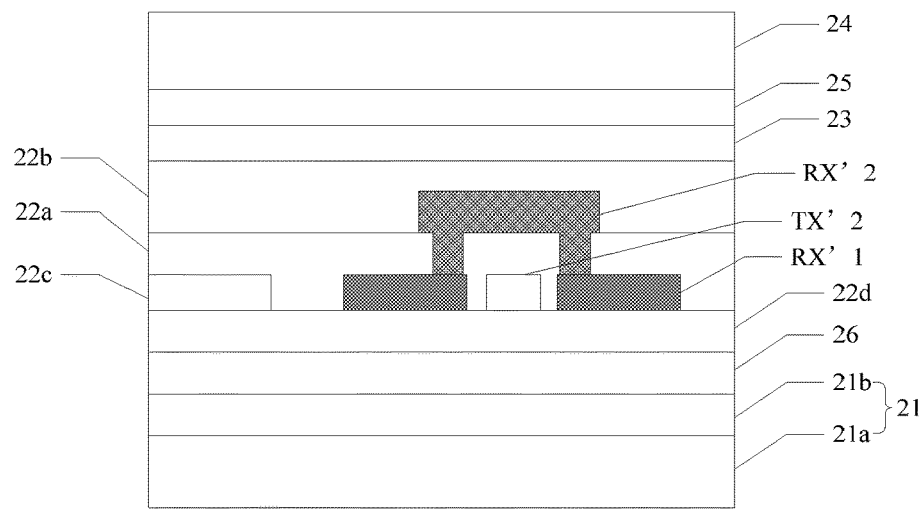
FIG. 9d is a cross-sectional view taken along line C-C' of FIG. 9c.

FIG. 9c is a plan view of a display module having an add-on touch structure according to an embodiment of the present disclosure, and FIG. 9d is a cross-sectional view taken along line C-C' of FIG. 9c. As shown in FIGS. 9c and 9d, the display module includes a display substrate 21 and a touch layer on a side of the display substrate 21. The display substrate 21 includes: a display functional layer 21a for display and an encapsulation layer 21b on a side of the display functional layer 21a. The touch layer includes: a driving electrode TX', a sensing electrode RX', a first insulating layer 22a, a second insulating layer 22b, a signal transmission line 22c, and a substrate 22d. The substrate 22d is bonded to a side of the encapsulation layer 21b away from the display functional layer 21a by the first optical adhesive 26. The driving electrode TX' includes a plurality of driving electrode blocks TX'1 arranged in a first direction and connection portions TX'2 each coupled between adjacent driving electrode blocks TX'1, the sensing electrode RX' includes sensing electrode blocks RX'1 and bridge portions RX'2 each coupled between adjacent sensing electrode blocks RX1, and the driving electrode TX' and the sensing electrode RX' are coupled to a touch signal terminal through a signal transmission line 22c. The driving electrode TX' and the sensing electrode block RX'1 are disposed in the same layer, and the bridge portion RX'2 is located on a side of the first insulating layer 22a away from the driving electrode TX'. The bridge portion RX'2 connects the adjacent sensing electrode blocks RX'1 through a via in the first insulating layer 12a. The display module further includes a polarizing layer 23 and a cover plate 24 which are sequentially arranged on the second insulating layer 22b along a direction away from the touch layer, and the polarizing layer 23 is bonded to the cover plate 24 through an optical adhesive layer 25.

In some embodiments, the bridge portion RX'2 is farther from the substrate 22d than the driving electrode TX' and is disposed in the second insulating layer 22b. The bridge portion RX'2 connects adjacent driving electrode blocks RX'1 through a via in the first insulating layer 22a.

In an embodiment, the driving electrode TX' and the sensing electrode RX' may be transparent electrodes.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A display module, comprising: a display substrate and a touch layer on a light emitting side of the display substrate, the display substrate comprising a plurality of light emitting units, each of the plurality of light emitting units comprising a first electrode, the first electrodes of the plurality of light emitting units being coupled to form a first electrode layer, wherein
the display module has a touch area and a driving area on a side of the touch area, the touch layer comprises a plurality of touch units in the touch area, and an orthographic projection of each of the plurality of touch units on the display substrate covers at least two light emitting units of the plurality of light emitting units, wherein each of the plurality of touch units comprises:
a mesh conductive structure coupled to a touch signal terminal in the driving area and comprising a plurality of conductive wires arranged crosswise to define a plurality of grids, an orthographic projection of each of the plurality of conductive wires on the display substrate being in a space between adjacent light emitting units; and
a plurality of first transparent electrodes, each of which is in the grid and electrically coupled to the conductive wire.

2. The display module of claim 1, wherein in each of the plurality of touch units,
a sum of an area of orthographic projections of the plurality of conductive wires on the display substrate and an area of orthographic projections of the plurality of first transparent electrodes on the display substrate is greater than ½ of an area of the touch unit.

3. The display module of claim 2, wherein areas of the plurality of touch units are the same, and in the plurality of touch units, areas of orthographic projections of the plurality of first transparent electrodes on the display substrate are the same.

4. The display module of claim 1, wherein each of the plurality of touch units further comprises a plurality of second transparent electrodes in a same layer as the plurality of first transparent electrodes, and
the plurality of first transparent electrodes are in some of the grids, the plurality of second transparent electrodes are in remaining grids, and the plurality of second transparent electrodes are insulated and spaced apart from the plurality of conductive wires.

5. The display module of claim 1, wherein the plurality of first transparent electrode each comprise a body portion and a connection portion electrically coupled to the body portion, the connection portion is electrically coupled to the conductive wire, and the conductive wire is on a side of the connection portion away from the display substrate.

6. The display module of claim 1, wherein a gap is provided on at least one of the plurality of conductive wires.

7. The display module of claim 5, wherein a gap is provided on at least one of the plurality of conductive wires, and the gap and the connection portion are provided on opposite sides of the grid.

8. The display module of claim 6, wherein in one touch unit,
the gap comprises a first gap, a second gap, and a third gap, the plurality of conductive wires of the mesh conductive structure comprise a plurality of horizontal wires extending along a row direction and a plurality of vertical wires extending along a column direction, and
the first gap is on a (2n)-th vertical wire, the second gap is on a (2n-1)-th vertical wire, and the third gap is on a horizontal wire between the (2n)-th vertical wire and the (2n-1)-th vertical wire, where n is a positive integer.

9. The display module of claim 1, wherein the plurality of light emitting units comprise a plurality of light emitting groups arranged in an array, each of the plurality of light emitting groups comprises a plurality of light emitting units of different colors, and each of the plurality of light emitting groups corresponds to at least one of the plurality of first transparent electrodes.

10. The display module of claim 2, wherein each of the plurality of light emitting groups comprises a red light emitting unit, a green light emitting unit, and a blue light emitting unit, a light emitting side of each of some of the plurality of light emitting groups is provided with one of the plurality of first transparent electrodes, and a light emitting side of each of remaining light emitting groups of the plurality of light emitting groups is provided with two of the plurality of first transparent electrodes.

11. The display module of claim 1, wherein a width of the conductive wire is less than 3 µm.

12. The display module of claim 1, wherein the touch layer further comprises a plurality of transmission lines, in each of the plurality of touch units, the mesh conductive structure is coupled to the touch signal terminal through a corresponding one of the plurality of transmission lines, and the transmission line and the mesh conductive structure are in a same layer.

13. The display module of claim 1, further comprising:

an encapsulation layer between the plurality of light emitting units and the touch layer;

a polarizing layer on a side of the touch layer away from the display substrate;

a protective layer between the touch layer and the polarizing layer;

a cover plate on a side of the polarizing layer away from the touch layer; and an optical adhesive layer between the cover plate and the polarizing layer.

14. A method for fabricating a display module having a touch area and a driving area on a side of the touch area, the method comprising:

providing a display substrate comprising a plurality of light emitting units, each of the plurality of light emitting units comprising a first electrode, and the first electrodes of the plurality of light emitting units being coupled to form a first electrode layer; and forming a touch layer on the display substrate, the touch layer comprising a plurality of touch units in the touch area, and an orthographic projection of each of the plurality of touch units on the display substrate covers at least two light emitting units of the plurality of light emitting units, wherein each of the plurality of touch units comprises: a mesh conductive structure and a plurality of first transparent electrodes, the mesh conductive structure is coupled to a touch signal terminal in the driving area and comprises a plurality of conductive wires arranged crosswise to define a plurality of grids, an orthographic projection of each of the plurality of conductive wires on the display substrate is in a space between adjacent light emitting units, and each of the plurality of first transparent electrodes is located in the grid and electrically coupled to the conductive wire.

15. The method of claim 14, wherein in each of the plurality of touch units, a sum of an area of orthographic projections of the plurality of conductive wires on the display substrate and an area of orthographic projections of the plurality of first transparent electrodes on the display substrate is greater than ½ of an area of the touch unit.

16. The method of claim 13, wherein a step of forming the mesh conductive structure is performed after a step of forming the first transparent electrode.

17. The method of claim 13, further comprising: forming a transmission line, wherein the mesh conductive structure is coupled to the touch signal terminal through the transmission line, and the transmission line is formed in synchronization with the mesh conductive structure.

18. A display device, comprising a driving chip and the display module of claim 1, the display device being configured to operate in a display stage and a touch detection stage; and the driving chip is configured to: provide a display driving signal to the light emitting unit to perform display in the display stage, and provide a touch signal to the touch unit to perform touch detection in the touch detection stage.

* * * * *